United States Patent [19]

Schonstedt

[11] Patent Number: 5,239,290

[45] Date of Patent: Aug. 24, 1993

[54] MAGNETIC CORES FOR SATURABLE CORE MEASURING DEVICES AND METHODS OF MANUFACTURING SUCH CORES

[75] Inventor: Erick O. Schonstedt, Reston, Va.

[73] Assignee: Schonstedt Instrument Company, Reston, Va.

[21] Appl. No.: 857,494

[22] Filed: Mar. 25, 1992

[51] Int. Cl.$^5$ .................... H01F 27/26; H02F 41/02
[52] U.S. Cl. .................... 336/213; 29/605; 29/607; 324/260; 324/233
[58] Field of Search ............... 336/233, 234, 212, 211, 336/213, 221; 29/605, 606, 607, 609; 324/260, 258, 261

[56] References Cited

U.S. PATENT DOCUMENTS

| | | | |
|---|---|---|---|
| 2,981,885 | 4/1961 | Schonstedt | 324/43 |
| 3,168,969 | 2/1965 | Schonstedt | 324/43 |
| 3,218,547 | 11/1965 | Ling | 324/43 |
| 3,404,360 | 10/1968 | Woodward | 336/211 |
| 3,445,928 | 5/1969 | Beynon | 29/606 |
| 3,909,704 | 9/1975 | Schonstedt | 336/198 |
| 4,591,788 | 5/1986 | Mohri et al. | 324/260 |
| 4,605,899 | 8/1986 | Eumurian et al. | 324/258 |
| 4,803,773 | 2/1989 | Schonstedt | 29/605 |
| 4,839,624 | 6/1989 | Schonstedt | 336/213 |

*Primary Examiner*—Thomas J. Kozma
*Attorney, Agent, or Firm*—Shapiro and Shapiro

[57] ABSTRACT

A magnetic core, for use in fluxgate magnetometers or gradiometers, for example, comprises a pair of coaxial coils constituted by strips of permeable magnetic material oppositely wound on a non-magnetic cylindrical tube. At each of their opposite ends, the coils terminate in planes perpendicular to the length of the tube. In the manufacture of a core, the strips at each end of the coils may be joined to each other to form a lap extending along the length of the tube. In one embodiment, strip portions extending beyond the respective planes, including a portion of each lap, are cut off and removed. In another embodiment, the entire lap at each end is removed after the strips at each end are welded to each other. By virtue of the core construction, the signal-to-noise ratio of saturable core measuring devices using the cores is substantially improved.

14 Claims, 1 Drawing Sheet

MAGNETIC CORES FOR SATURABLE CORE MEASURING DEVICES AND METHODS OF MANUFACTURING SUCH CORES

BACKGROUND OF THE INVENTION

This invention relates to magnetic cores for use in saturable core measuring devices, such as fluxgate magnetometers and gradiometers, for example, and is more particularly concerned with magnetic core constructions that provide improved signal-to-noise ratios in such devices.

U.S. Pat. No. 2,981,885, issued Apr. 25, 1961 to the present inventor, and incorporated herein by reference, discloses magnetic cores that have contributed greatly to the commercial success of saturable core measuring devices. In the manufacture of such cores, thin strips of permeable magnetic material, such as Permalloy, are oppositely wound and interwoven on a non-magnetic cylindrical tube so as to provide a pair of superposed coaxial coils. At each of the opposite ends of the coils, the respective ends of the strips are joined to each other, as by crimping, to form a lap that extends lengthwise of the cylindrical tube.

BRIEF DESCRIPTION OF THE INVENTION

The present invention provides improved magnetic cores of the foregoing type, that substantially increase signal-to-noise ratios of saturable core measuring devices employing the improved cores.

Unexpectedly high signal-to-noise ratios are achieved, in accordance with the invention, by terminating the superposed coils, at the opposite ends thereof, in respective planes that are substantially perpendicular to the length of the core. When a core is first manufactured in the manner disclosed in U.S. Pat. No. 2,981,885, the present invention involves cutting off portions of the strips that extend beyond respective termination planes. In one embodiment, the cutting of the strips removes most of the laps at the respective ends of the superposed coils, while in another embodiment all of the laps are removed. In at least the last-mentioned embodiment, the strips are preferably welded to each other at the opposite ends of the coils. When appropriate, they may also be welded to the cylindrical tube.

BRIEF DESCRIPTION OF THE DRAWINGS

The invention will be further described in conjunction with the accompanying drawings, which illustrate preferred (best mode) embodiments, and wherein.

DETAILED DESCRIPTION OF PREFERRED EMBODIMENTS

Figure 1A:
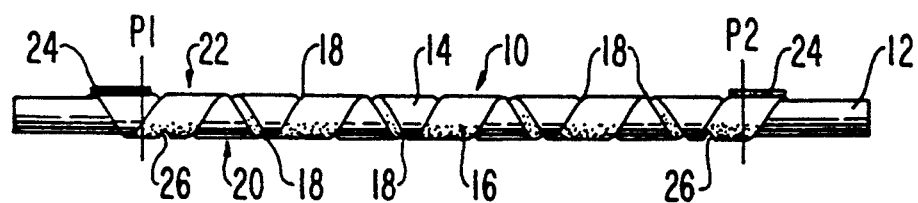
FIG. 1A is a side elevation view of a magnetic core formed as disclosed in U.S. Pat. No. 2,981,885 and indicating the manner in which the core is modified in accordance with a first embodiment of the present invention.
Figure 2A:
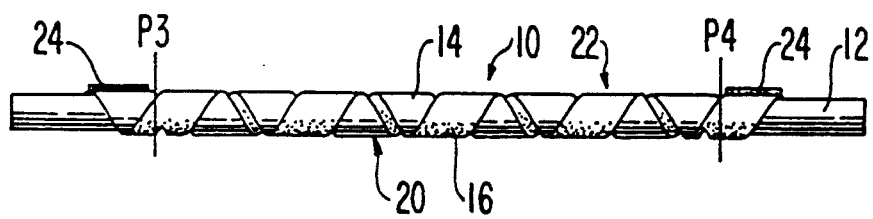
FIGS. 2A and 2B are side elevation views similar to FIGS. 1A and 1B, respectively, relating to a second embodiment of the invention.

As indicated in FIGS. 1A and 2A, magnetic cores of the present invention are preferably formed by modifying magnetic cores that have first been manufactured in the manner disclosed in U.S. Pat. No. 2,981,885. In accordance with that patent, a magnetic core 10 comprises a non-magnetic elongated support 12, such as a cylindrical tube of a highly refractory ceramic, on which are wound two interwoven thin rectangular strips 14, 16 of a permeable magnetic material such as Permalloy. The strips, which are differentiated in the drawings by shading and stippling, respectively, are helically wound longitudinally about the tube in opposite directions such that one strip has a right-hand helix angle and the other has a left-hand helix angle. Each strip preferably passes under the other twice and then over the other twice, and the strips are preferably wound so that small diamond shape metal-free spaces 18 are formed, one for each half convolution of the two strips. The strips thus form two superposed coils 20, 22.

The corresponding adjacent ends of the strips, at each of the opposite ends of the coils, are joined to each other, as by crimping, to form a lap 24 that extends longitudinally of the cylindrical tube 12, so that the end portions of the strips cannot unwind. Also, to prevent substantial longitudinal movement of the coils 20, 22 relative to the tube 12, the tube is provided with external circumferential notches 26 into which the thin strip material is pressed. After the strips are wound on the tube, the assembled parts are suitably heat treated in an atmosphere of dry hydrogen to obtain the desired highly permeable magnetic properties of the strips.

The interwoven construction of the cores places each of the strips at the same average distance from the longitudinal axis of the cores and ensures that each strip is excited by substantially the same amount of magnetic flux when the cores are used in saturable core measuring devices, such as fluxgate magnetometers or gradiometers. For the most satisfactory performance when the cores are used in highly refined measuring instruments, the cores are interwoven in such a manner that substantially the same amounts of the two strips are exposed when the core is viewed in any direction perpendicular to the longitudinal axis of the core. Unequal exposure may result in the generation of second harmonic fluxes which are out of phase with signal fluxes when there is a component of field perpendicular to the longitudinal axis of the core. The "under-two, over-two" winding arrangement of FIGS. 1A and 2A produces the desired substantially equal exposure of the two strips.

As shown in FIGS. 1A, 1B and 2A, 2B, the manufacture of an improved magnetic core 10' or 10" of the present invention from a core constructed as disclosed in U.S. Pat. No. 2,981,885 involves terminating the superposed coils 20, 22, at each of the opposite ends thereof, in substantially circular core end surfaces that lie in planes P1, P2 or P3, P4 that are substantially perpendicular to the longitudinal axis of the core, i.e., perpendicular to the length of the tube 12. In each of the illustrated embodiments of the invention, portions of the strips that extend beyond the planes at the respective ends of the coils are cut off and thus removed, leaving coils 20', 22' or 20", 22".

Figure 1B:
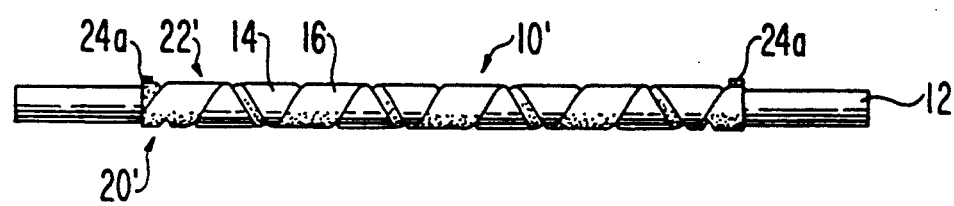
FIG. 1B is a side elevation view of a resultant magnetic core in accordance with the first embodiment of the present invention.

In the embodiment shown in FIGS. 1A and 1B most of the laps 24 at the opposite ends of the coils 22, 24 are removed, but a small (minor) portion 24a of each lap remains, the length of each remaining lap portion being substantially less than the full width of the strips, as shown in FIG. 1B. In the embodiment shown in FIGS. 2A and 2B, the laps 24 are completely removed after the strips at opposite ends of the coils are spot welded to each other, as indicated by spot welds 28.

If the tube is formed of a weldable material, such as Inconel 750, the strips may also be spot welded to the tube, as indicated by spot welds 30.

In the embodiment of FIGS. 1A and 1B, the notches 26 at opposite ends of the core are located in their usual positions. However, in the embodiment of FIGS. 2A and 2B, the notches 26 are positioned more closely to each other.

Figure 2B:
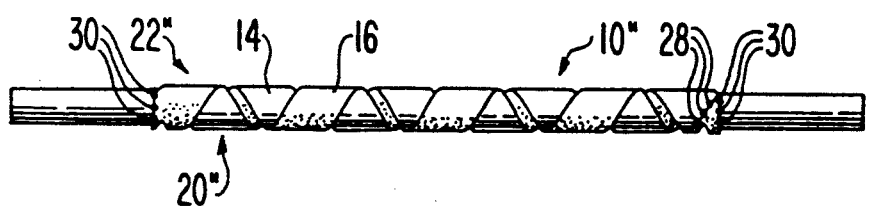

Comparing FIG. 1B with FIG. 1A, and comparing FIG. 2B with FIG. 2A, it is apparent that the ends of the coils of a core 10' or 10" of the invention are "squared off," while the ends of the coils of the prior core 10 slant, so that those coils are longer along the lap side than along the opposite side. The "end effects" of the prior coils produce more "noise" than the coils of the present invention, and hence the signal-to-noise ratio of measuring instruments employing the cores of the present invention is substantially improved.

Figure 3:
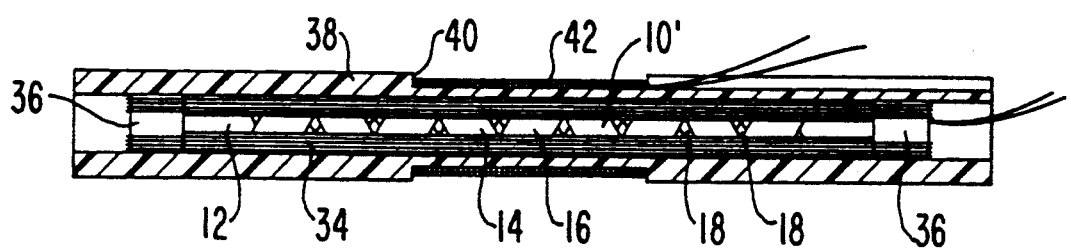
FIG. 3 is a longitudinal sectional view of a magnetic sensor assembly employing a magnetic core of the invention.

FIG. 3 illustrates a typical magnetic sensor 32 in which a magnetic core (10' (or 10")) in accordance with the present invention may be used. In fluxgate magnetometers or gradiometers, sensors of the type shown in FIG. 3 are commonly employed in pairs, with the sensors spaced apart colinearly in a non-magnetic tubular housing.

As shown in FIG. 3, and as described in U.S. Pat. No. 2,981,885, the magnetic sensor 32 comprises a toroidal excitation winding 34 wound about the core. The winding may be made of insulated copper wire, and an electrical current in the wire produces an annular flux about the axis of the core. The excitation winding is supported by a pair of slotted plastic ferrules or sleeves 36 which fit over the ends of the tube 12. Longitudinal circumferentially spaced slots of the ferrules receive the turns of the excitation winding, which pass over the exterior of the core and are threaded through the core. Each slot may receive five turns of the excitation winding, for example, which may be wound one after another in one slot and then wound successively in the next slot, and so on. The assembly of the excitation winding and the core is inserted in a plastic tube 38 having an annular notch 40 in which a pick-up winding 42 is wound.

When sensors of the type shown in FIG. 3 are employed in a fluxgate magnetometer or gradiometer, for example, the cores are driven into saturation during opposite half cycles of AC excitation, and the outputs of the signal windings of a pair of colinear sensors are nulled to produce a zero output when the magnetometer or gradiometer is in a uniform magnetic field so that the sensors are equally affected by the external field. When the sensors are unequally affected, there is a net second harmonic signal output.

In tests of fluxgate magnetometers and gradiometers employing improved magnetic cores of the present invention, signal-to-noise ratios were increased by about 30 percent compared with magnetometers and gradiometers using prior magnetic cores of the type disclosed in U.S. Pat. No. 2,981,885. The improvement was somewhat greater in magnetic cores constructed as shown in FIG. 2B compared with cores constructed as shown in FIG. 1B, by virtue of the total elimination of the laps.

While preferred embodiments of the invention have been shown and described, it will be apparent to those skilled in the art that changes can be made in these embodiments without departing from the principles and spirit of the invention, the scope of which is defined in the appended claims. For example, while the invention has been described with reference to magnetic cores that are first constructed in accordance with U.S. Pat. No. 2,981,885, the invention has applicability to other types of cores employing wound strips of permeable magnetic material, such as cores constructed in the manner disclosed in U.S. Pat. No. 4,803,773 and 4,839,624, issued Feb. 4, 1989 and Jun. 13, 1989, respectively, to the present inventor, and incorporated herein by reference. Also, instead of a small lap or welding to stabilize the ends of the strips of magnetic material, the end portions of the strips may be held in place adhesively, for example, or by other means.

I claim:

1. A magnetic core comprising a non-magnetic elongated support and a pair of coaxial coils constituted by strips of permeable magnetic material oppositely wound helically about said support along the length thereof, said coils terminating at opposite ends thereof in substantially circular core end surfaces that lie in respective planes that are substantially perpendicular to the length of said support.

2. A magnetic core according to claim 1, wherein said strips are interwoven.

3. A magnetic core according to claim 1, wherein said coils are superposed.

4. A magnetic core according to claim 1, wherein, at each of the opposite ends of said coils, the strips are joined to each other by a lap extending along the length of said support, the length of each lap being substantially less than the full width of the strips.

5. A magnetic core according to claim 1, wherein, at each of the opposite ends of said coils, the strips are welded to each other.

6. A magnetic core according to claim 5, wherein, at each of the opposite ends of said coils, the strips are welded to said support.

7. A method of making a magnetic core, comprising oppositely helically winding a pair of strips of permeable magnetic material on a non-magnetic elongated support so as to form coaxial coils, and terminating said coils at opposite ends thereof in substantially circular core end surfaces that lie in respective planes that are substantially perpendicular to the length of said support.

8. A method according to claim 7, wherein the strips are interwoven as they are oppositely wound.

9. A method according to claim 7, wherein said coils are superposed as they are wound.

10. A method according to claim 7, wherein said terminating comprises cutting off portions of said strips that extend beyond the respective planes.

11. A method according to claim 10, wherein, prior to the cutting off of said strip portions, the strips, at each end of said coils, are joined to form a lap that extends along the length of said support, and wherein at least part of each lap is removed when said strip portions are cut off.

12. A method according to claim 11, wherein all of the laps are removed.

13. A method according to claim 12, wherein, at each of the opposite ends of said coils, the strips are welded to each other before removal of the laps.

14. A method according to claim 12, wherein, at each of the opposite ends of said coils, the strips are welded to said support.

* * * * *